United States Patent
Cassidy et al.

(10) Patent No.: US 10,797,669 B2
(45) Date of Patent: Oct. 6, 2020

(54) SPEAKER WITH AUTOMATIC VOLUME CONTROL

(71) Applicant: Federal Signal Corporation, Oak Brook, IL (US)

(72) Inventors: Scott M. Cassidy, Crown Point, IN (US); Lonnie E. Moravetz, Lincoln, NE (US); Mark J. Dietel, Lincoln, NE (US)

(73) Assignee: Federal Signal Corporation, Oak Brook, IL (US)

( * ) Notice: Subject to any disclaimer, the term of this patent is extended or adjusted under 35 U.S.C. 154(b) by 34 days.

(21) Appl. No.: 15/864,218

(22) Filed: Jan. 8, 2018

(65) Prior Publication Data

US 2019/0214957 A1   Jul. 11, 2019

(51) Int. Cl.
| | |
|---|---|
| *H03G 3/32* | (2006.01) |
| *H04R 1/02* | (2006.01) |
| *H04R 3/00* | (2006.01) |
| *H04R 29/00* | (2006.01) |
| *G08B 7/06* | (2006.01) |
| *H04L 29/08* | (2006.01) |

(52) U.S. Cl.
CPC ................ *H03G 3/32* (2013.01); *G08B 7/06* (2013.01); *H04R 1/025* (2013.01); *H04R 3/00* (2013.01); *H04R 29/001* (2013.01); *H04L 69/325* (2013.01)

(58) Field of Classification Search
CPC . H03G 3/32; H04R 1/025; H04R 3/00; H04R 3/007
USPC ...................................... 381/55, 57
See application file for complete search history.

(56) References Cited

U.S. PATENT DOCUMENTS

| | | | |
|---|---|---|---|
| 5,093,658 A | 3/1992 | Grothause | |
| 5,847,610 A * | 12/1998 | Fujita | H03F 1/52 330/298 |
| 8,229,104 B2 | 7/2012 | Riedl et al. | |
| 2005/0276432 A1* | 12/2005 | Hsieh | H04R 1/345 381/341 |
| 2007/0147625 A1 | 6/2007 | Shields | |
| 2011/0181452 A1* | 7/2011 | Raifel | H04R 3/02 341/110 |
| 2012/0106759 A1 | 5/2012 | Chung | |
| 2014/0241533 A1* | 8/2014 | Gerrish | G08B 25/04 381/57 |

(Continued)

FOREIGN PATENT DOCUMENTS

| | | |
|---|---|---|
| WO | 2004086358 A1 | 10/2004 |
| WO | 2017005302 A1 | 1/2017 |

OTHER PUBLICATIONS

NAVSHIPS 0967-105-8010, "Technical Manual for Audio Frequency Amplifier AM-3729/SR", Feb. 2, 1966 (Year: 1966).*

(Continued)

*Primary Examiner* — David L Ton
(74) *Attorney, Agent, or Firm* — Merchant & Gould P.C.

(57) ABSTRACT

An example speaker for providing alerts includes: a housing and a cover forming an integrated unit; a microphone configured to sense an ambient noise level; and a processor configured to adjust a volume of the speaker based upon the ambient noise level. A hinge can be positioned between the housing and the cover to allow the cover to be pivoted relative to the housing from a close position to an open position.

16 Claims, 12 Drawing Sheets

(56) References Cited

U.S. PATENT DOCUMENTS

2019/0141439 A1* 5/2019 Hernandez Garcia ... H04R 3/12

OTHER PUBLICATIONS

"Flameproof & Non-Incendive Loudspeakers BEXL Series Explosion Proof & Non-Incendive Public Address Loudspeakers", (Year: 2012).*

"Instruction Manual (ATEX/IECEx) BExL25D and BExL15D Flameproof Loudspeakers", Apr. 7, 2012 (Year: 2012).*

Federal Signal Informer, "Informer-IP," https://www.fedsig.com/product/informer-ip, © 2018 Federal Signal, 6 pages.

Federal Signal, "P-LS2B and P-LS2C Corrosion Resistant Zone 1 Loudspeaker," https://www.fedsig.com/product/p-ls2b-and-p-ls2c-corrosion-resistant-zone-1-loudspeaker, © 2018 Federal Signal, 4 pages.

Edwards Signaling, "5532MHV Series," https://www.edwards-signals.com/index.cfm?pid=1608,level=7, © United Technologies Corporation 2018, 1 page.

GAI-Tronics, "Explosionproof Speakers IEC," https://www.gai-tronics.com/indcomsystems/ancillary_products/speakers/exprfspeaker_iec.htm, Copyright © 2013 GAI-Tronics® A Hubbell Company, 2 pages.

* cited by examiner

SPEAKER WITH AUTOMATIC VOLUME CONTROL

BACKGROUND

Alerting systems can use various components to provide information to individuals on a site. This information can take the form of alarms that indicate certain conditions are present on the site. Challenges exist to provide adequate coverage for the entire site, particularly when conditions at the site (e.g., loud ambient noise) can periodically impact the ability to deliver the audible alerts.

SUMMARY

In one aspect, an example speaker for providing alerts can include: a housing and a cover forming an integrated unit; a microphone configured to sense an ambient noise level; and a processor configured to adjust a volume of the speaker based upon the ambient noise level.

This summary is provided to introduce a selection of concepts, in a simplified form, that are further described below. This summary is not intended to be used in any way to limit the scope of the claimed subject matter.

DETAILED DESCRIPTION

The present disclosure is directed to Internet Protocol (IP)-enabled speakers. The example speakers can be used as notification devices using audible cues like tones and/or voice. The speakers can be paired to other components within system for additional capabilities.

In some examples, the speakers include an internal amplifier and driver to deliver intelligible voice messages from prerecorded files. Further, the speakers can include ambient level monitors that enable the speakers to automatically adjust speaker volume in relationship to ambient noise level. Further, the speakers can include remote volume control for optimizing sound levels across an alerting area.

In some examples, the example notifications and alerts from the speakers can be live voice, text-to-speech, pre-recorded messages and/or tone files. When used with optional notification software, alert messages initiated from the speakers can be sent to emergency personnel via other methods as well, such as email, SMS, handheld radios, etc.; and can also be used to activate other speakers.

The speakers can further include two relay outputs for controlling strobes to provide for visual alerting or other alerting devices (e.g., message boards, lights, beacons, etc.) coupled to the speakers. The speakers can be configured for outdoor use or large indoor structures, and can be powered by 24 VDC and/or 120/240 VAC. All wiring interfaces can be accessible via internal connectors for quick and easy installation.

Figure 1:
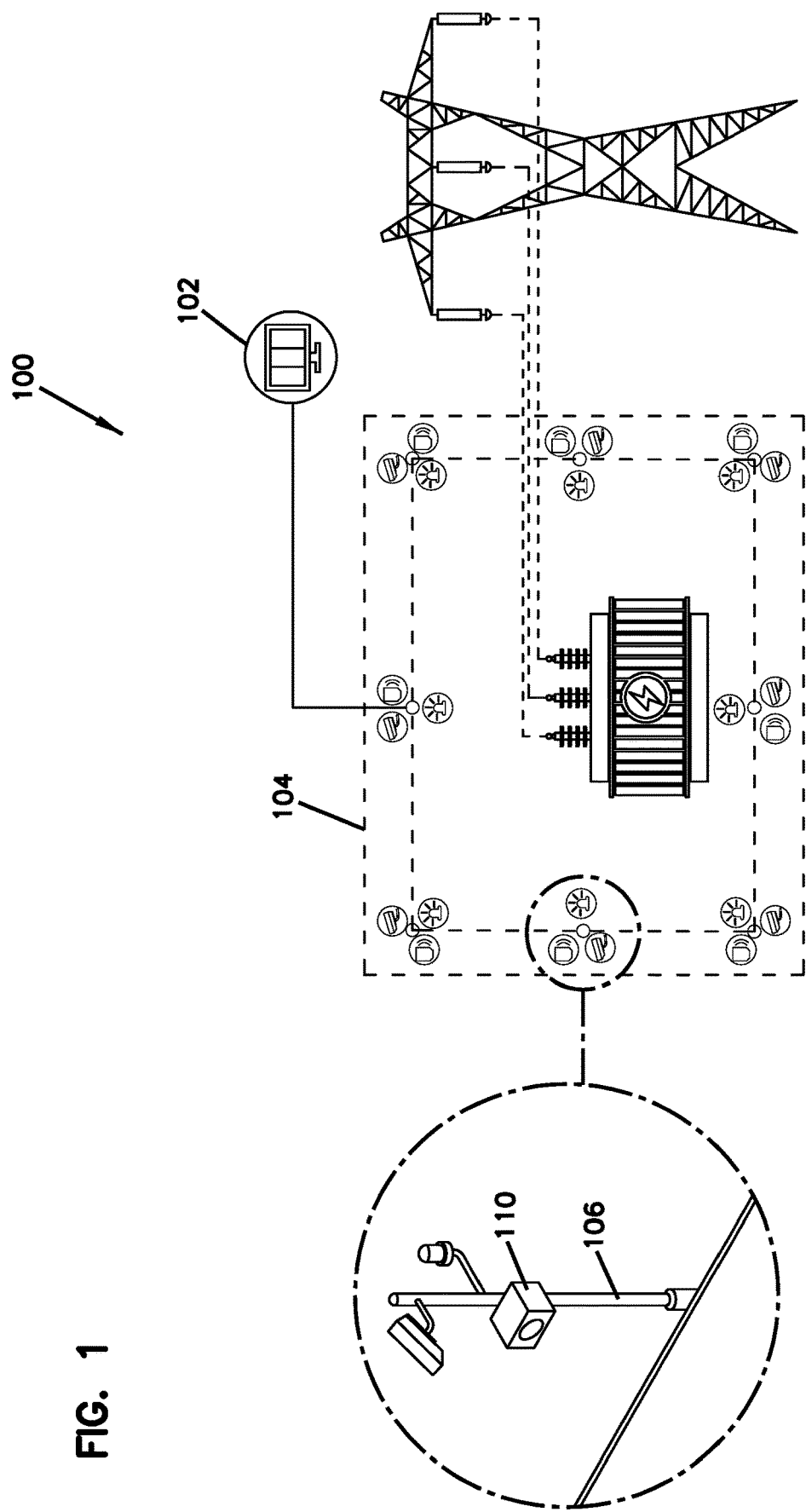
FIG. 1 shows an example system including a speaker.
Figure 2:
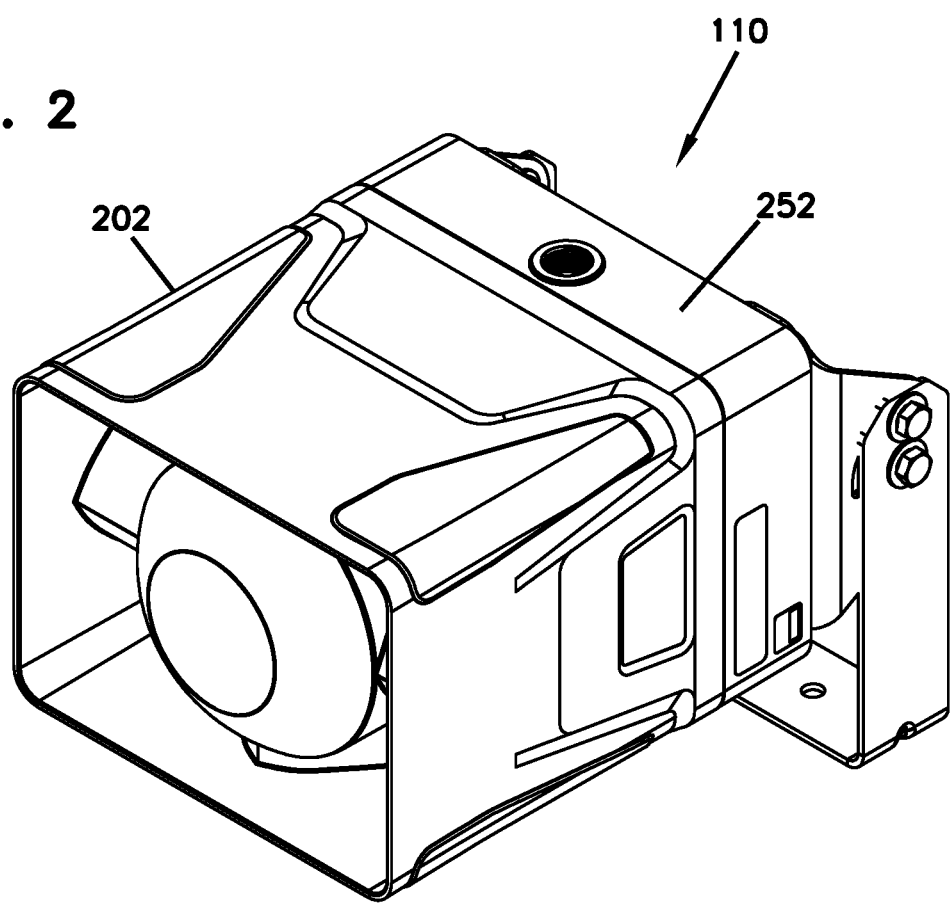
FIG. 2 shows a perspective view of a first embodiment of a speaker.
Figure 3:
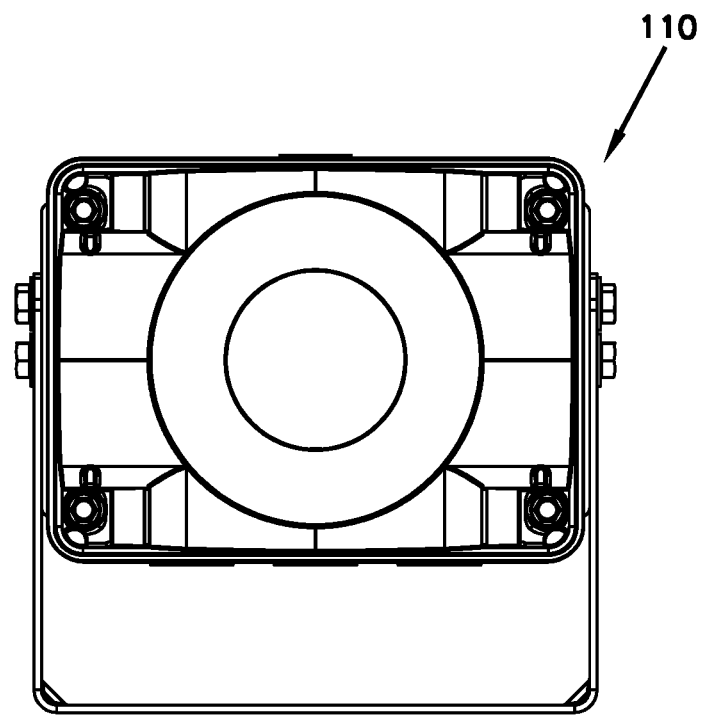
FIG. 3 shows a front view of the speaker of FIG. 1.
Figure 4:
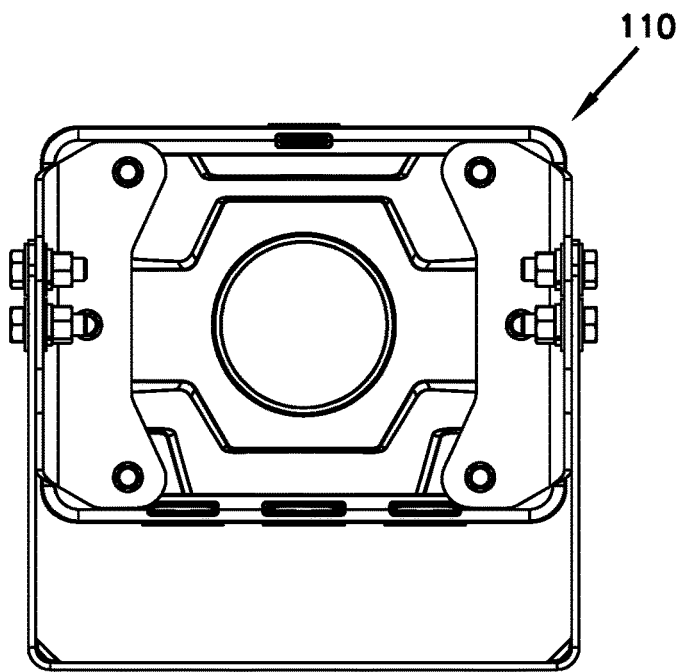
FIG. 4 shows a back view of the speaker of FIG. 1.
Figure 5:
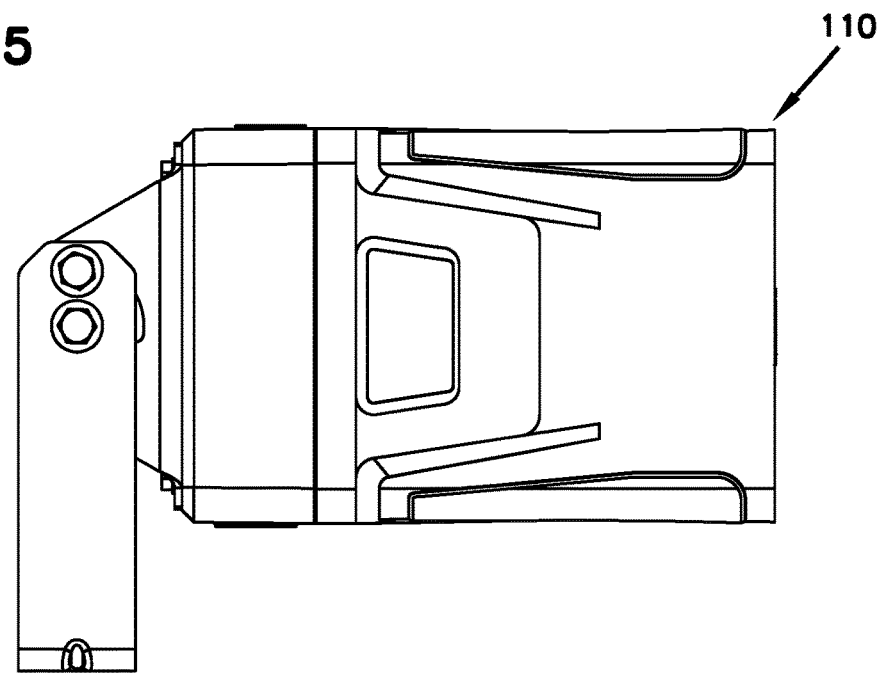
FIG. 5 shows a side view of the speaker of FIG. 1.
Figure 6:
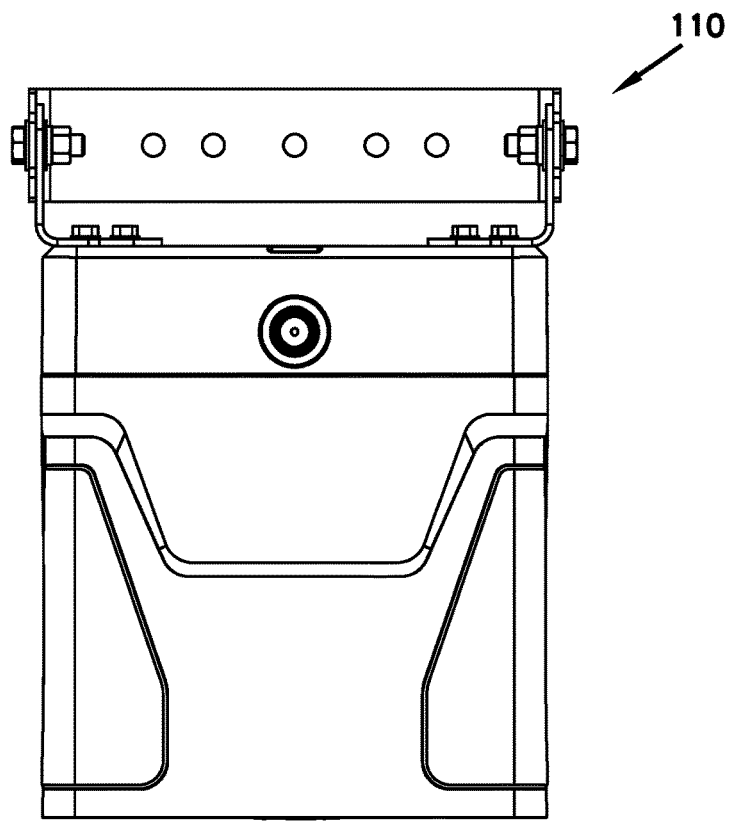
FIG. 6 shows a top view of the speaker of FIG. 1.
Figure 7:
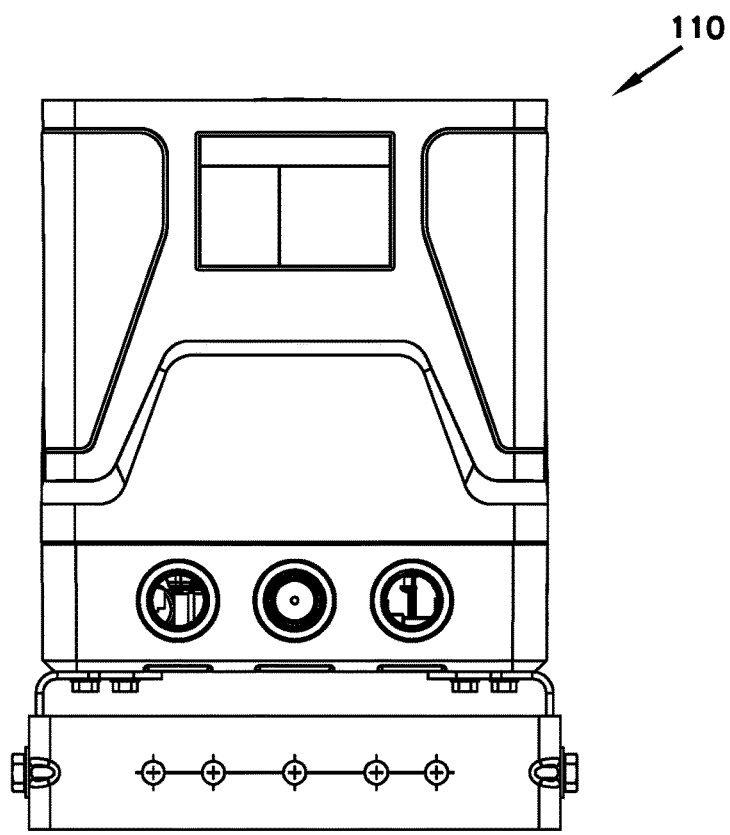
FIG. 7 shows a bottom view of the speaker of FIG. 1.

Referring now to FIG. 1, an example system 100 including a speaker 110 is shown. In this example system 100, the speaker 110 is positioned on a pole 106 at a site 104 at which alerting is needed. In this example, the site 104 is a power grid distribution site, although any other type of site can be used.

A remote site 102 controls the speaker 110 through a wired and/or wireless connection. The communication scheme between one or more computing devices at the remote site 102 and the speaker 110 includes IP-based packets (TCP/IP or UDP). In this example, the remote site 102 can control various aspects of the speaker 110, such as turning the speaker on/off, changing the volume of the speaker, etc. One example of a system that can be used to control the speaker 110 is the Federal Commander Digital System provided by Federal Signal Corporation of Oak Brook, Ill. Other configurations are possible.

Referring now to FIGS. 2-9, the example speaker 110 is shown in more detail. In this example, the speaker 110 is powered by 120/240 VAC, although other configurations are possible (see FIGS. 13-14).

Figure 8:
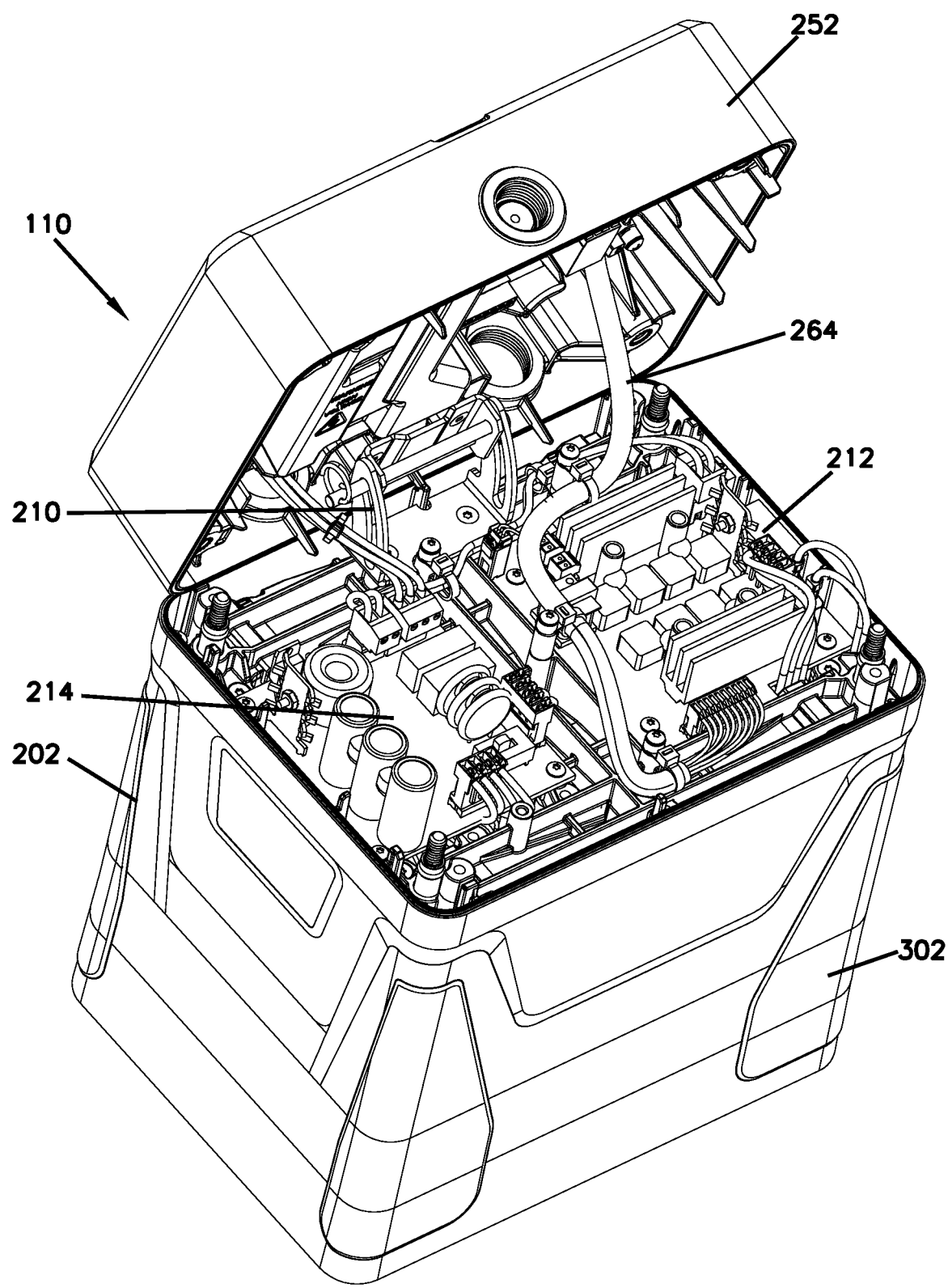
FIG. 8 shows a perspective view of the speaker of FIG. 1 with the cover assembly pivoted to an open position.
Figure 9:
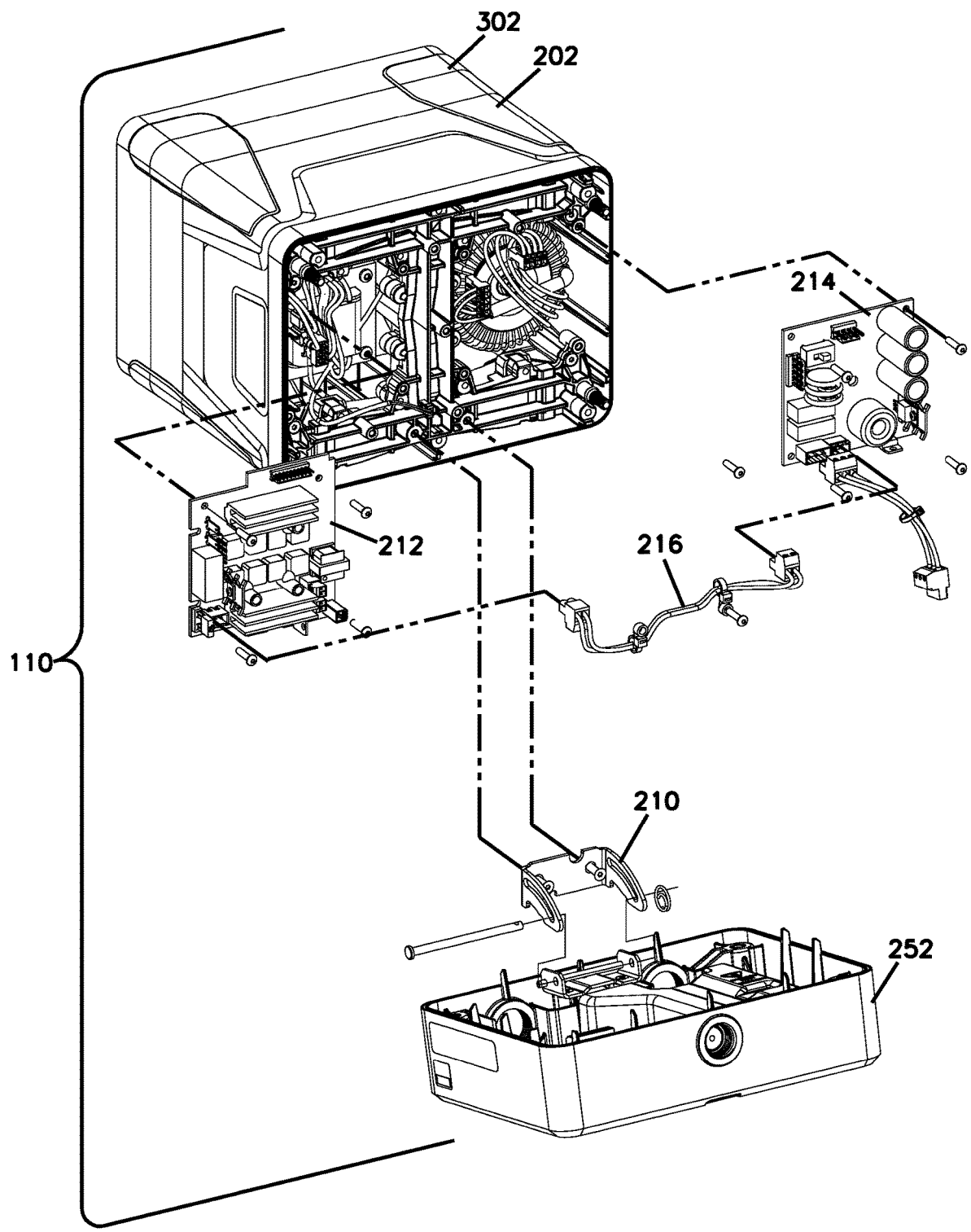
FIG. 9 shows a perspective view of the speaker of FIG. 1 in partially exploded form.
Figure 10:
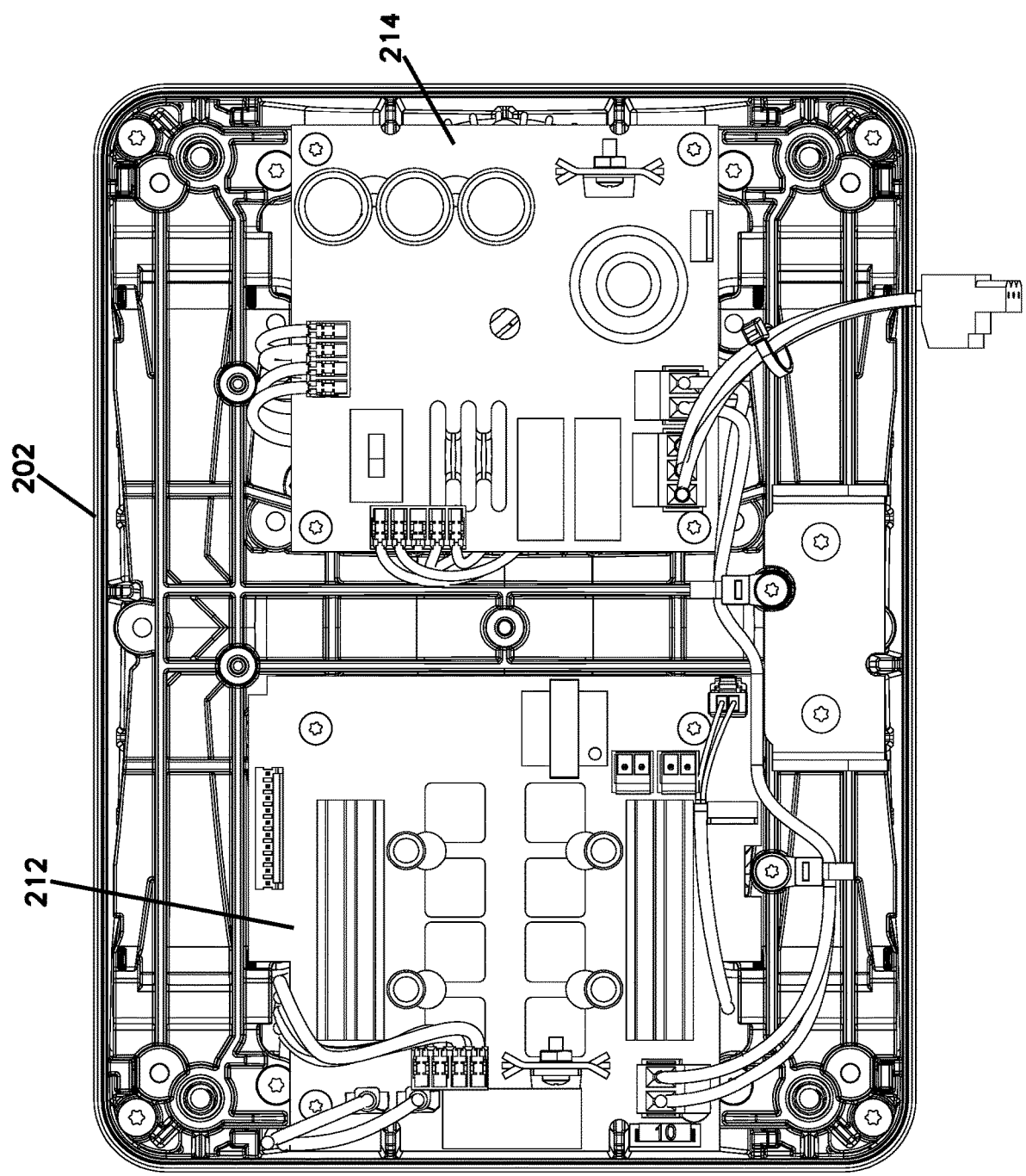
FIG. 10 shows a top view of the speaker of FIG. 1 with the cover assembly removed.
Figure 11:
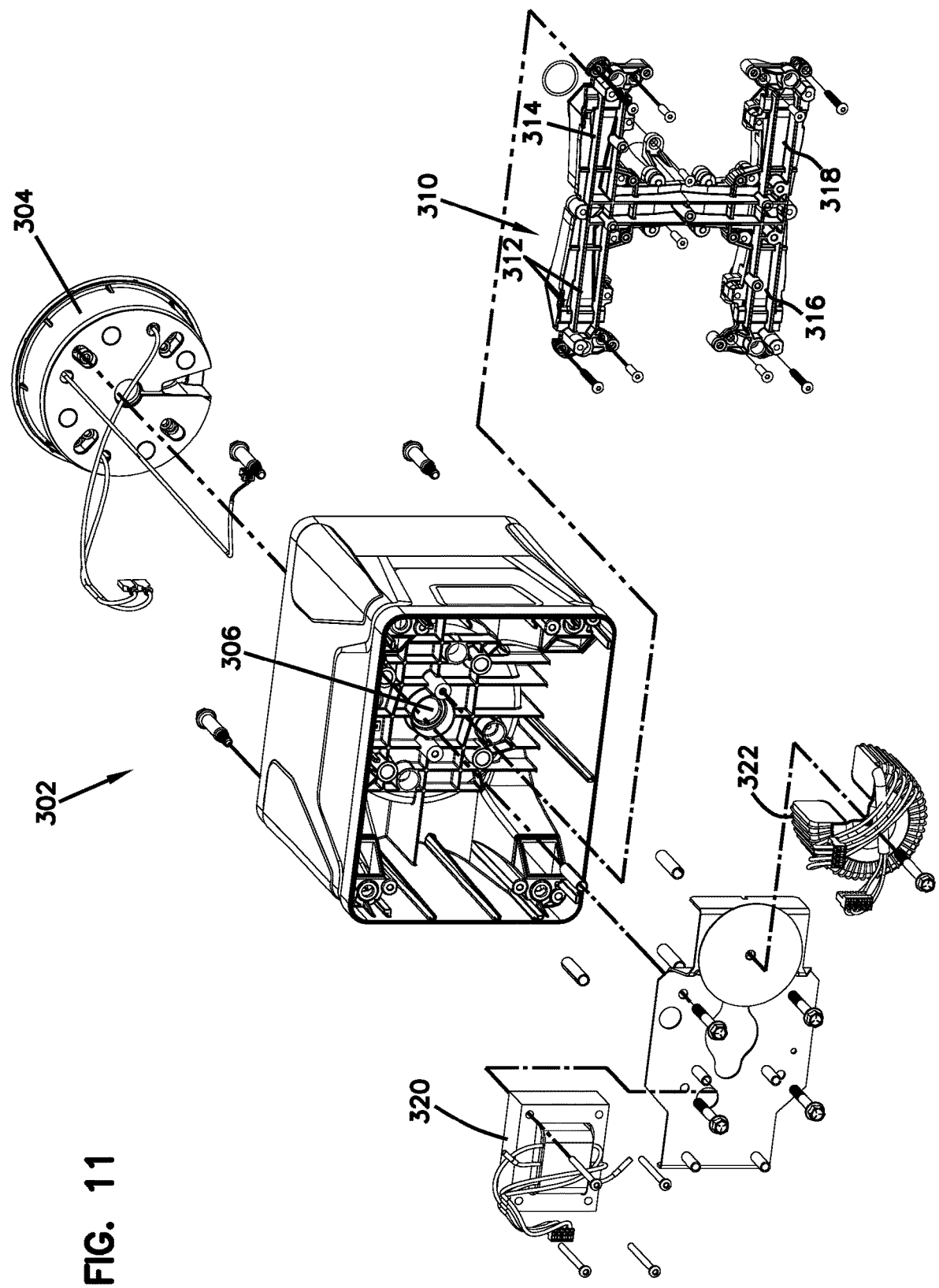
FIG. 11 shows a perspective view of the housing assembly of the speaker of FIG. 1 in exploded form.
Figure 12:
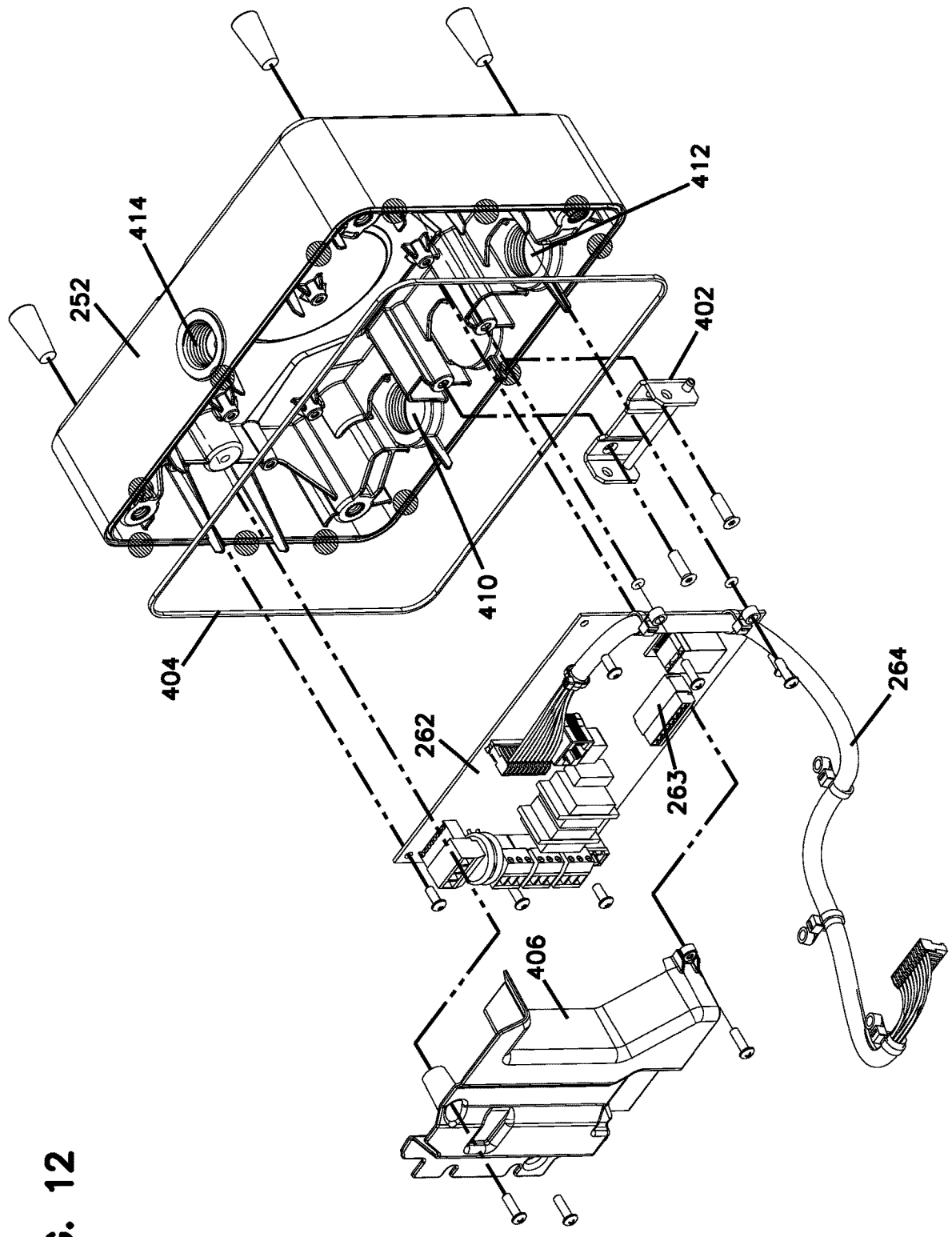
FIG. 12 shows a perspective view of the cover assembly of the speaker of FIG. 1 in exploded form.

The speaker 110 includes a housing assembly 202 (sees FIGS. 9-11) and a cover assembly 252 (see FIG. 12). The cover assembly 252 is coupled to the housing assembly 202 of the speaker 110 by a bracket 210 that allows the cover assembly 252 to be pivoted from a closed position (FIG. 2) to an open position (FIG. 8). This allows for easy access to the internal components of the speaker 110. When in the closed position, the housing assembly 202 and the cover assembly 252 form a single, integrated package that provides all of the functionality of the speaker 110 described herein.

As shown in FIGS. 2-10, the housing assembly 202 encloses various components of the speaker 110. This includes an amplifier 212 that amplifies the signal to the speaker 110 and provides the alerting notification to a driver 304 (see FIG. 11). A power supply 214 provides power to the amplifier 212 through a wiring harness 216 and power to a control board 262 through a wiring harness 264.

Referring now to FIG. 11, a horn sub-assembly 302 of the housing assembly 202 is shown. The horn sub-assembly 302 includes the driver 304 that compresses air through an aperture 306 formed in the horn sub-assembly 302. The compressed air is delivered from the aperture 306 to a manifold 310. The manifold 310 include four channels 312, 314, 316, 318 that direct the air in four directions. This allows for a longer path for the air to create a richer horn tone.

The horn sub-assembly 302 also includes an impedance matching transformer 320 that increases the amplifier output voltage applied to the speaker. A power transformer 322 is also provided to convert the AC power from the power supply 214 to a DC voltage/current that can be used to power the horn sub-assembly 302.

As shown in FIGS. 2-9 and 12, the cover assembly 252 encloses various other components of the speaker 110. This includes the control board 262 that controls the operation of the speaker 110. In this example, the control board 262 can include various components of a computing device, such as those described in reference to FIG. 15. For example, the control board 262 can include a processor, such as a programmable logic controller (PLC), and memory.

In some examples, the control board 262 provides a standard PLC data interface (e.g., OPC, MODBUS, PROFINET) that more easily allows third party applications to communicate with the speaker 110. For example, the PLC data interface can allow third party applications to monitor and control aspects of the speaker 110. One example of this is a third party application that monitors the performance of the speaker 110.

For example, the PLC can initiate playback of digitally stored tones, messages, and predefined relay output sequences. Criteria such as sound pressure level (SPL), voltage, current, temperature, etc. within the speaker 110 can be communicated through the PLC data interface to the third part. Other examples are possible.

The speaker 110 can also be configured to accept local contact closures 263 on the control board 262. This allows the speaker 110 and/or a network of speakers to be controlled through the local contact closures. For example, the local contact closures 263 can be configured for normally open or normally closed contacts and be configured as momentary or continuous. A momentary closure initiates a process to start for a predefined duration. Continuous executes a processes for the duration of the contract closure.

The memory can encode instructions that, when executed by the processor, cause the processor to control aspects of the speaker 110, such as the issuance of alerts (tone and/or voice), the volume, and/or auxiliary components coupled to the speaker 110 (e.g., a strobe). For example, the speaker 110 can deliver tone warnings and intelligible voice messages stored in the memory.

A cover 406 is positioned over portions of the control board 262 to protect and isolate those components from other components in the speaker 110.

The cover assembly 252 also includes a gasket 404 that is positioned on the edge of the cover assembly 252 so that the gasket 404 engages the housing assembly 202 when the cover assembly 252 is pivoted to the closed position (see FIGS. 2-7). This allows the cover assembly 252 and the housing assembly 202 to form a water-tight enclosure.

Further, the cover assembly 252 includes a bracket 402 that interfaces with the bracket 210 of the housing assembly 202 to allow the cover to pivot as described above (see FIG. 8).

Finally, the cover assembly 252 forms apertures 410, 412, 414 that are sized to allow cables to be run from outside of the speaker 110 to the inside of the speaker 110. Such cables can include power and data cables. The apertures 410, 412, 414 can be plugged or otherwise closed when not used to minimize water and debris intrusion into the speaker 110.

As noted, the speaker 110 can provide alerting functions by providing audible tones and/or messages. In addition, the speaker 110 can be configured to provide remote volume control for optimizing sound levels across an alerting area (e.g., site 104). The remote volume control also includes an ambient noise monitoring capability to automatically adjust volume depending on external noise levels.

For example, the remote site 102 can control the volume of the speaker 110 by communicating with the speaker 110 through TCP/IP. Specifically, the remote site 102 can increase or decrease the volume of the speaker 110 when the speaker 110 emits alerts and/or messages. This can be done automatically (e.g., at certain times of the day) or manually (e.g., when a certain event that generates ambient noise requiring an increase in alerting volume).

In another example, the speaker 110 is programmed to sense ambient noise around the speaker 110 and to automatically adjust the volume of the speaker appropriately. In this configuration, the driver 304 can be used as a microphone to sense the level of ambient noise surrounding the speaker 110. In one example, the processor of the speaker 110 can increase or decrease the volume of the speaker 110 based upon that sensed ambient noise. In another example, the speaker 110 can report the ambient noise level to the remote site 102, and the remote site 102 can adjust the volume of the speaker 110 appropriately.

For example, the ambient sensed noise can be sensed and compared to a threshold. If the ambient sensed noise exceeds the threshold, the speaker volume can be increased. On the other hand, if the ambient sensed noise is less than a threshold, the speaker volume can be decreased. Multiple thresholds can be used in order to increase and/or decrease speaker volume based upon the ambient noise. For example, a configurable threshold can be used to enable the user to define how the speaker will react to ambient noise. This can be advantageous, for example, when an event on the site causes an increase in ambient noise, which could impact the ability to efficiently provide audible alerting by the speaker 110.

In some examples, the volume and thresholds can be set manually. For example, pre-defined level controls can be used to pre-define a maximum speaker sound pressure level that is independent from the ambient sound pressure level.

In other examples, the speaker 110 can be provide an automatic level control, as described above. This automatic level control can be enabled and disabled as desired. Various modes can be provided for the automatic level control.

A Linear ALC Option (LALC) mode changes the speaker's sound pressure level in a linear correlation with ambient sound pressure level after the ambient sound level drops below an ambient sound pressure level threshold. The speaker's sound pressure level will rise and fall linearly until the ambient sound pressure level reaches an ambient threshold set for maximum speaker sound pressure level.

A Stepped ALC Option (SALC) mode is performed as a step function where the speaker sound pressure level changes in one or more pre-determined steps when the ambient sound pressure level reaches one or more pre-determined ambient sound pressure level thresholds.

In a mixed mode, a pre-defined level control can be used in conjunction with one or more of the LALC or SALC modes.

A Fixed Differential ALC (FDALC) mode allows the user to pre-define a sound pressure level differential between the speaker's sound pressure level and ambient sound pressure level. The differential will be maintained until the speaker's maximum or minimum levels are reached.

Various statistical averaging techniques can be used to determine ambient sound pressure levels. In some examples, Lx averaging determines an SPL level that is exceeded x percent of a time period. Further, Tx averaging defines a time measurement window used to select measurement samples and apply the Lx averaging algorithm.

For example, an Lx of "L10" provides averaging with a 10 second averaging window to filter noise that lasts less than 10% of the time and still quickly react to longer term noise that will affect intelligibility. Other values of Lx (e.g., L50 or less) and Tx may be incorporated to change filtering characteristics.

Further, as noted above, the housing assembly 202 and the cover assembly 252 of the speaker 110 form an integrated package that is modular and singular in design. This integrated package can be advantageous because it can be formed to house all of the needed components of the speaker 110 while providing the necessary integrity to allow the speaker 110 to be mounted in both indoor and outdoor environments. Further, the modularity of the speaker 110 (e.g., the housing assembly 202 with the horn sub-assembly 302 and the cover assembly 252) allow the speaker 110 to be easily accessed and serviced.

In some examples, the speaker 110 provides one or more components that can monitor various operating attributes of the internal environment and operation of the speaker 110. For example, such operating attributes as speaker voltage, current, and/or temperature can be monitored. This monitoring can include reporting of such operating attributes, reducing speaker output to lower operating temperatures and/or alerting/alarming if one or more operating attributes falls outside a given norm. For example, if the internal temperature of the speaker exceeds a maximum value, the speaker can report the temperature and/or turn off automatically.

In the examples shown, the circuitry for the speaker 110 is a nonincendive circuit. This configuration can allow the speaker 110 to be used in C1D2 classified areas, where the hazardous environment does not allow conventional speakers to be used safely.

Figure 13:
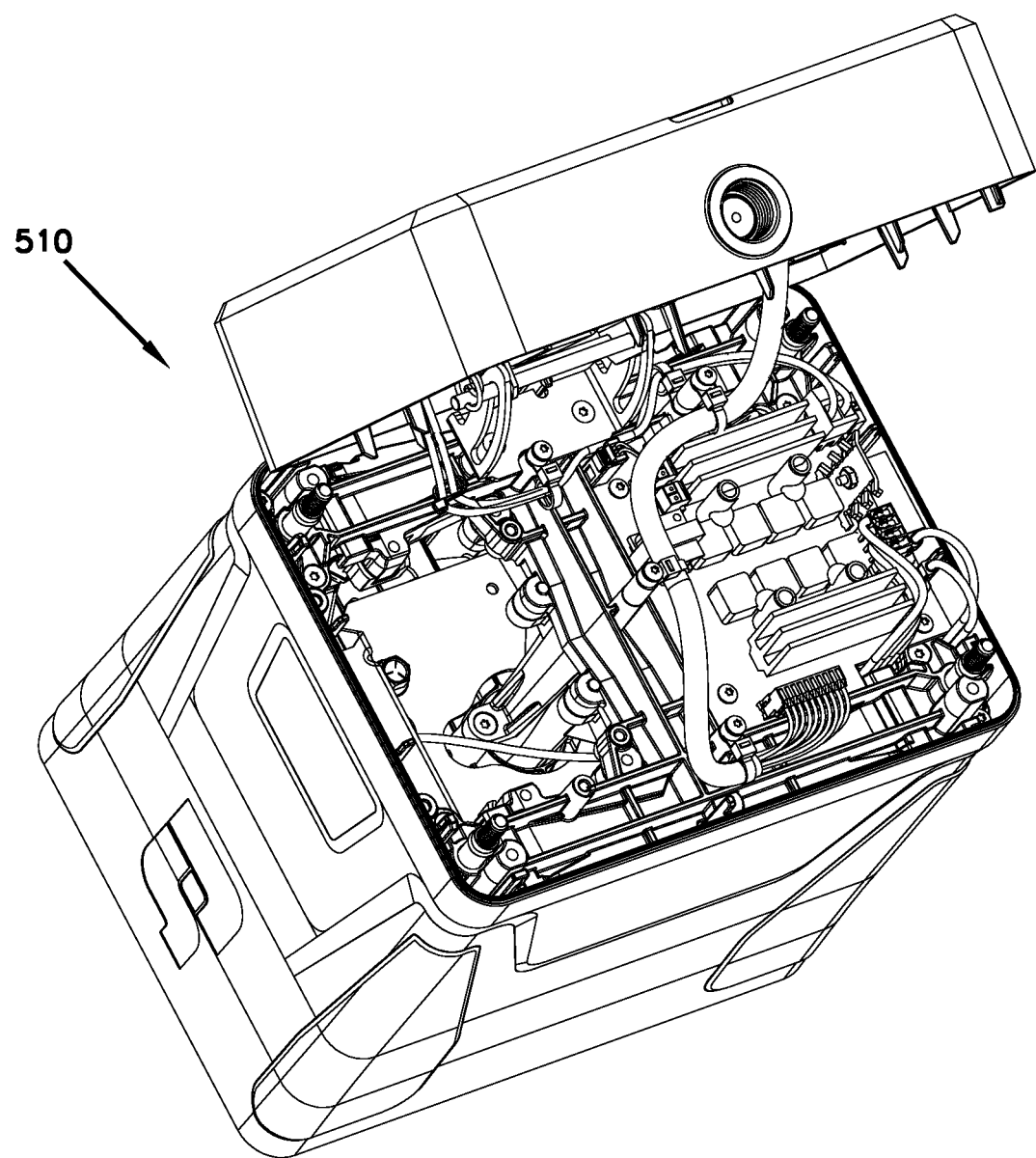
FIG. 13 shows a perspective view of a second embodiment of a speaker with the cover assembly pivoted into an open position.
Figure 14:
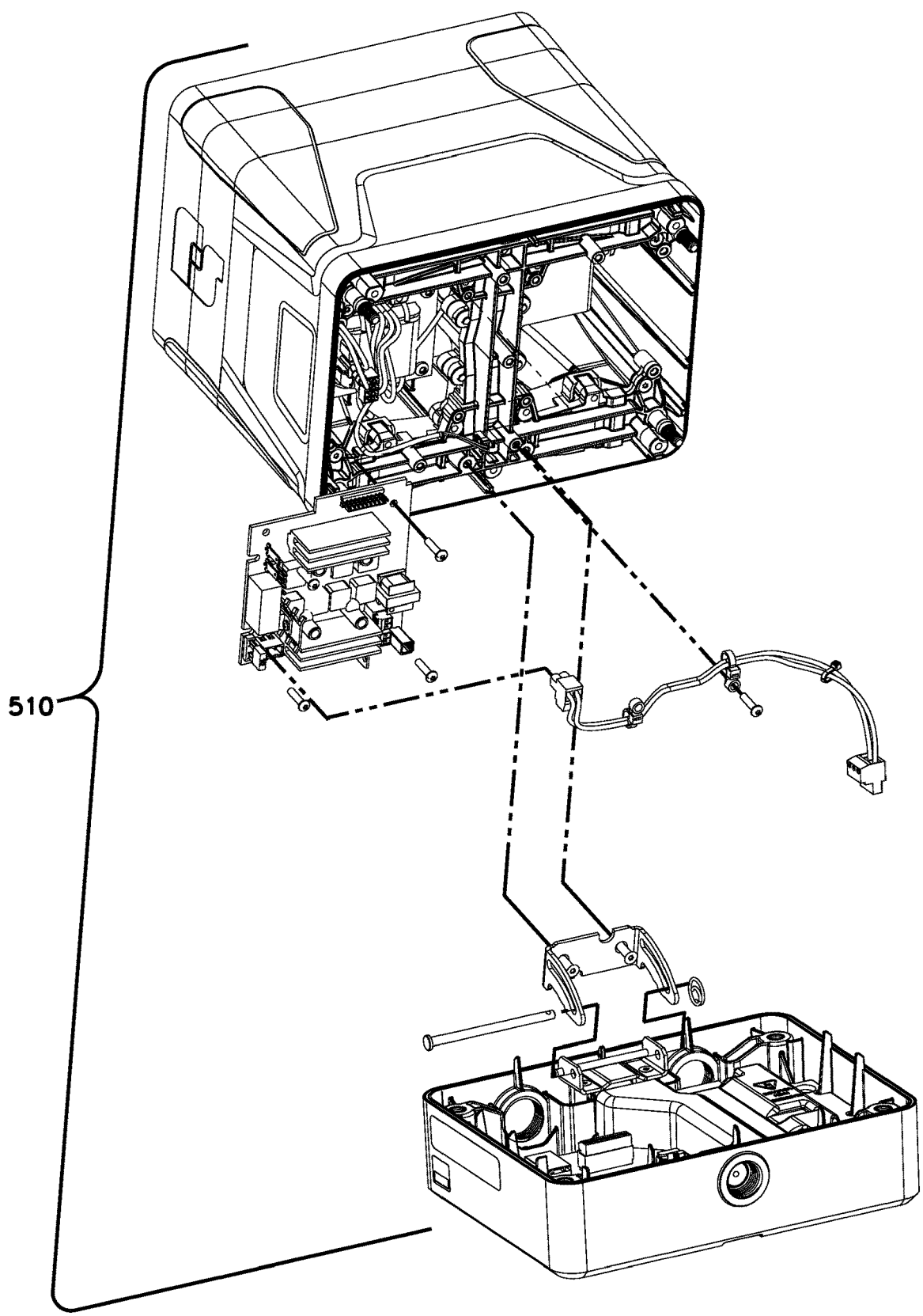
FIG. 14 shows a perspective view of the speaker of FIG. 13 in partially exploded form.

Referring now to FIGS. 13-14, another example speaker 510 is shown. The speaker 510 is substantially identical to the speaker 110 described above, except the speaker 510 is powered by a DC power source (e.g., 24 VDC). Since the power source is direct current, the speaker 510 does not include a power transformer (i.e., the power transformer 322 of the speaker 110).

Figure 15:
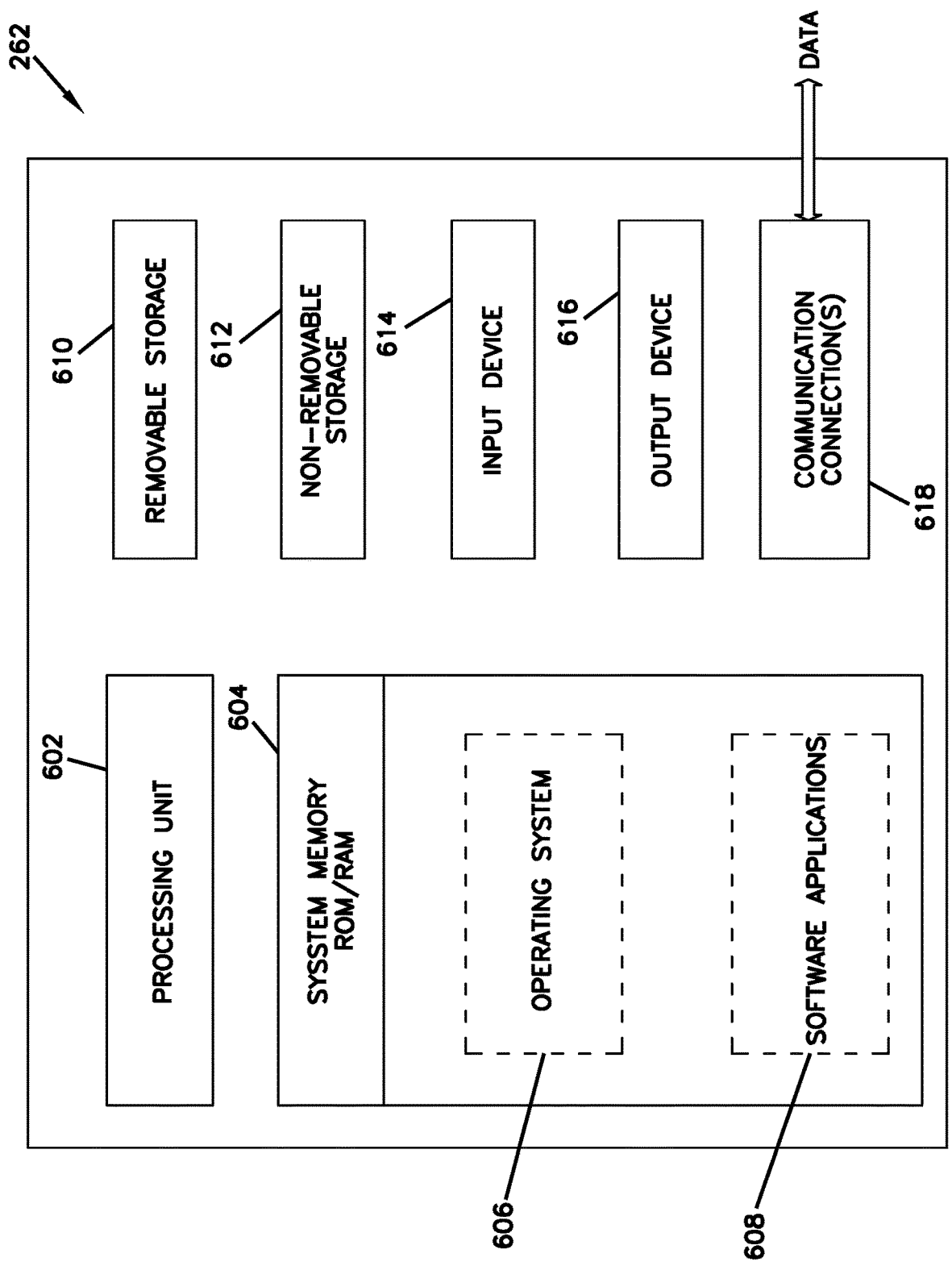
FIG. 15 shows a schematic view of example components of the control board of the speaker of FIG. 1.

Referring now to FIG. 15, a schematic view of example components of the control board 262 of the speaker 110 are shown. Generally, the control board 262 includes various components of a computing device.

The control board 262 includes a processing unit 602 and a system memory 604. The system memory 604 stores an operating system 606 for controlling the operation of the speaker 110. The system memory 604 further includes one or more software applications 608. Software applications 608 include many different types of single and multiple-functionality programs that control various aspects of the functionality of the speaker 110. Other embodiments are possible.

The system memory 604 is computer-readable media. Examples of computer-readable media include computer storage media and communication media. Computer storage media is physical and/or tangible media that is distinguished from communication media.

Computer storage media includes physical volatile and non-volatile, removable and non-removable media implemented in any method or technology for storage of information such as computer-readable instructions, data structures, program modules, or other data. Computer storage media also includes, but is not limited to, RAM, ROM, EEPROM, flash memory or other memory technology, CD-ROM, DVD or other optical storage, magnetic cassettes, magnetic tape, magnetic disk storage or other magnetic storage devices, or any other physical medium which can be used to store the desired information. Any such computer storage media may be part of or external to the speaker 110. For example, in some embodiments, such storage is illustrated in FIG. 15 by removable storage 610 (e.g., micro SD memory cards) and non-removable storage 612.

Communication media is typically embodied by computer-readable instructions, data structures, program modules, or other data, in a modulated data signal, such as a carrier wave or other transport mechanism, and includes any information delivery media. The term "modulated data signal" describes a signal that has one or more of its characteristics set or changed in such a manner as to encode information in the signal. By way of example, communication media includes wired media such as a wired network or direct-wired connection, and wireless media such as acoustic, RF, infrared and other wireless media.

The control board 262 also includes any number and type of an input device 614 and output device 616. An example input device 614 includes a relay contact, push button, keyboard, mouse, pen, voice input device, touch input device, and others. An example output device 616 includes a display, speakers, printer, and others. The control board 262 also includes a communication connection 618 configured to enable communications with other computing devices directly and/or over a network in a distributed computing system environment.

The example embodiments described herein can be implemented as logical operations in a computing device in a networked computing system environment. The logical operations can be implemented as: (i) a sequence of computer implemented instructions, steps, or program modules running on a computing device; and (ii) interconnected logic or hardware modules running within a computing device.

For example, the logical operations can be implemented as algorithms in software, firmware, analog/digital circuitry, and/or any combination thereof, without deviating from the scope of the present disclosure. The software, firmware, or similar sequence of computer instructions can be encoded and stored upon a computer readable storage medium and can also be encoded within a carrier-wave signal for transmission between computing devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus for providing alerts, the apparatus comprising:
a housing and a cover;
a hinge positioned between the housing and the cover to allow the cover to be pivoted relative to the housing from a close position to an open position, thereby maintaining all wiring of the apparatus in a connected state;
an audio device having a driver configured to compress air, the driver being operable in a first configuration as a speaker to provide alerts and operable in a second configuration as a microphone configured to sense an ambient noise level, the driver being positioned in, and fixed relative to, the housing;
a control board including a programmable logic controller data interface programmed to allow third parties to control or monitor the speaker, the control board being positioned in, and fixed relative to, the cover;

a wire electrically connecting the control board to a component positioned in, and fixed relative to, the housing; and a processor configured to adjust a volume of the speaker based upon the ambient noise level.

2. The apparatus of claim 1, further comprising a manifold defining a plurality of channels, with each of the channels providing a pathway for air being provided to the driver of the speaker.

3. The apparatus of claim 1, wherein the processor is configured to allow the apparatus to communicate with a remote computing device.

4. The apparatus of claim 3, wherein the volume of the speaker is controlled by the remote computing device.

5. The apparatus of claim 3, wherein the apparatus communicates with the remote computing device using an Internet Protocol communications protocol.

6. The apparatus of claim 1, wherein the processor is configured to provide data relating to an operating characteristic of the speaker.

7. The apparatus of claim 6, wherein the operating characteristic is one or more of voltage, current, and temperature.

8. The apparatus of claim 1, wherein the processor is further programmed to provide an automatic level control for the volume of the speaker.

9. The apparatus of claim 8, wherein the processor is further programmed to provide one or more automatic level control modes.

10. The apparatus of claim 9, wherein the automatic level control modes include one or more of:

a linear mode that changes the volume in a linear correlation with the ambient noise level;

a stepped mode that changes the volume in one or more pre-determined steps with the ambient noise level; and a fixed differential mode that allows a pre-defined sound pressure level differential between the volume and the ambient noise level.

11. The apparatus of claim 1, further comprising local contact closures that are configured to control the speaker.

12. The apparatus of claim 1, further comprising a non-incendive circuit.

13. An apparatus for providing alerts, the apparatus comprising:

a housing and a cover forming an integrated unit;

a hinge positioned between the housing and the cover to allow the cover to be pivoted relative to the housing from a close position to an open position, thereby maintaining all wiring of the apparatus in a connected state;

an audio device having at least one component that is operable in a first configuration as a speaker to provide alerts and operable in a second configuration as a microphone configured to sense an ambient noise level, the at least one component being a driver configured to compress air, the driver being positioned in, and fixed relative to, the housing;

a manifold defining a plurality of channels, with each of the channels providing a pathway for air being provided to the driver of the speaker;

a control board including a programmable logic controller data interface programmed to allow third parties to control or monitor the speaker, the control board being positioned in, and fixed relative to, the cover;

a wire electrically connecting the control board to a component positioned in, and fixed relative to, the housing; and a processor configured to:

adjust a volume of the speaker based upon the ambient noise level;

provide data relating to an operating characteristic of the speaker, the operating characteristic being one or more of speaker pressure level, voltage, current, and temperature; and allow the apparatus to communicate with a remote computing device.

14. The apparatus of claim 13, wherein the volume of the speaker is controlled by the remote computing device.

15. The apparatus of claim 13, wherein the apparatus communicates with the remote computing device using an Internet Protocol communications protocol.

16. The apparatus of claim 13, wherein the processor is further programmed to provide one or more automatic level control modes, wherein the automatic level control modes include one or more of:

a linear mode that changes the volume in a linear correlation with the ambient noise level;

a stepped mode that changes the volume in one or more pre-determined steps with the ambient noise level; and a fixed differential mode that allows a pre-defined sound pressure level differential between the volume and the ambient noise level.

* * * * *